(12) United States Patent
Pasadyn et al.

(10) Patent No.: US 6,444,481 B1
(45) Date of Patent: Sep. 3, 2002

(54) METHOD AND APPARATUS FOR CONTROLLING A PLATING PROCESS

(75) Inventors: Alexander J. Pasadyn; Thomas J. Sonderman, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/897,626

(22) Filed: Jul. 2, 2001

(51) Int. Cl.[7] .............................................. H01L 21/00
(52) U.S. Cl. ........................... 438/5; 700/299; 118/667
(58) Field of Search ..................... 438/687, 5, 6–13, 438/14, 16; 118/663, 667; 700/299

(56) References Cited

U.S. PATENT DOCUMENTS 6,238,539 B1 * 5/2001 Joyce et al. ............. 204/228.7

* cited by examiner

Primary Examiner—Craig Thompson
(74) Attorney, Agent, or Firm—Williams, Morgan & Amerson, P.C.

(57) ABSTRACT

A method for controlling a plating process includes plating a process layer on a wafer in accordance with a recipe; measuring a thickness of the process layer; and determining at least one plating parameter of the recipe for subsequently formed process layers based on the measured thickness. A processing line includes a plating tool, a metrology tool, and a process controller. The plating tool is adapted to form a process layer on a wafer in accordance with a recipe. The metrology tool is adapted to measure a thickness of the process layer. The process controller is adapted to determine at least one plating parameter of the recipe for subsequently formed process layers based on the measured thickness.

27 Claims, 3 Drawing Sheets

US 6,444,481 B1

METHOD AND APPARATUS FOR CONTROLLING A PLATING PROCESS

BACKGROUND OF THE INVENTION

1. FIELD OF THE INVENTION

This invention relates generally to the field of semiconductor device manufacturing and, more particularly, to a method and apparatus for controlling a plating process.

2. DESCRIPTION OF THE RELATED ART

A conventional integrated circuit device, such as a microprocessor, is typically comprised of many thousands of semiconductor devices, e.g., transistors, formed above the surface of a semi-conductive substrate. For the integrated circuit device to function, the transistors must be electrically connected to one another through conductive interconnect structures. Many modem integrated circuit devices are very densely packed, i.e., there is very little space between the transistors formed above the substrate. Thus, these conductive interconnect structures must be made in multiple layers to conserve plot space on the semiconductive substrate.

The conductive interconnect structures are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another. For certain types of interconnect structures, such as those formed using copper, the conductive lines that connect the various interconnect structures are commonly formed in trenches defined in the dielectric layers.

A contact is generally used to define an interconnect structure (e.g., comprised of polysilicon or metal) to an underlying polysilicon layer (e.g., source/drain or gate region of a transistor), while a via denotes a metal to metal interconnect structure. For contacts and vias, a contact opening is formed in an insulating layer overlying the conductive member. A second conductive layer is then formed over the contact opening and electrical communication is established with the conductive member.

An exemplary semiconductor device 100 is shown in FIGS. 1A and 1B. The semiconductor device 100 includes trenches 110, 120 used to form conductive line interconnect structures and a contact opening 130 used to form a conductive plug interconnect structure defined in a base insulating layer 135. The contact opening 130 communicates with an underlying conductive feature 137 (e.g., metal line) formed in a previous layer of the semiconductor device 100. The trenches 110, 120 and contact opening 130 are lined with one or more barrier layers 140 and/or seed layers 150 and filled with a conductive layer 160 (e.g., a copper layer formed by electroplating). The seed layer 150 is shown using phantom lines as it is becomes homogenous with the conductive layer 160 during the plating process. A stop layer 170 is provided for protecting the base insulating layer 135 during a subsequent polishing process used to remove portions of the layers 140, 150 and conductive layer 160 extending beyond the trenches 110, 120 and contact opening 130, as shown in FIG. 1B.

The barrier layer 140 functions to inhibit electromigration of the copper fill layer in the trenches 110, 120 and contact opening 130. Electromigration is the displacement of metal ions in the copper layer due to the current flow in the line. The force of the propagating electrons is commonly referred to as "electron wind." Over long periods of time, voids left behind by displaced ions accumulate. Eventually, an open circuit may occur, causing the semiconductor device to irreparably fail. Commonly used barrier layer materials include tantalum and tantalum nitride. An exemplary barrier layer 140 configuration includes a tantalum nitride layer lining the trenches 110 and contact opening 120 and a tantalum layer overlying the tantalum nitride layer.

The seed layer 150, typically comprising a deposited layer of copper or a copper alloy, is formed over the barrier layer 140 by a physical vapor deposition process (i.e., sputtering). The seed layer 150 is coupled to a voltage source during the subsequent plating of the conductive layer 160 to fill the trenches 110, 120 and contact opening 130 to complete the interconnect structures.

The conductive layer plating parameters (e.g., plating time, electrolyte temperature, and potential) affect the grain size of the conductive layer 160 and its integrity (i.e., whether seams or voids are present), which in turn affect the electrical parameters of the completed device. The plating parameters also affect the thickness of the conductive layer 160. If the conductive layer 160 is insufficiently thick, the trenches 110, 120 and contact openings 130 may be insufficiently filled. If the conductive layer 160 is thicker than necessary, the efficiency and cost-effectiveness of the processing line are reduced due waste from the additional conductive material and additional processing time and materials required to polish the conductive material extending beyond the trenches 110, 120 and contact openings 130.

The present invention is directed to overcoming, or at least reducing the effects of, one or more of the problems set forth above.

SUMMARY OF THE INVENTION

One aspect of the present invention is seen in a method for controlling a plating process. The method includes plating a process layer on a wafer in accordance with a recipe; measuring a thickness of the process layer; and determining at least one plating parameter of the recipe for subsequently formed process layers based on the measured thickness.

Another aspect of the present invention is seen in a processing line including a plating tool, a metrology tool, and a process controller. The plating tool is adapted to form a process layer on a wafer in accordance with a recipe. The metrology tool is adapted to measure a thickness of the process layer. The process controller is adapted to determine at least one plating parameter of the recipe for subsequently formed process layers based on the measured thickness.

BRIEF DESCRIPTION OF THE DRAWINGS

The invention may be understood by reference to the following description taken in conjunction with the accompanying drawings, in which like reference numerals identify like elements, and in which.

Figure 1A:
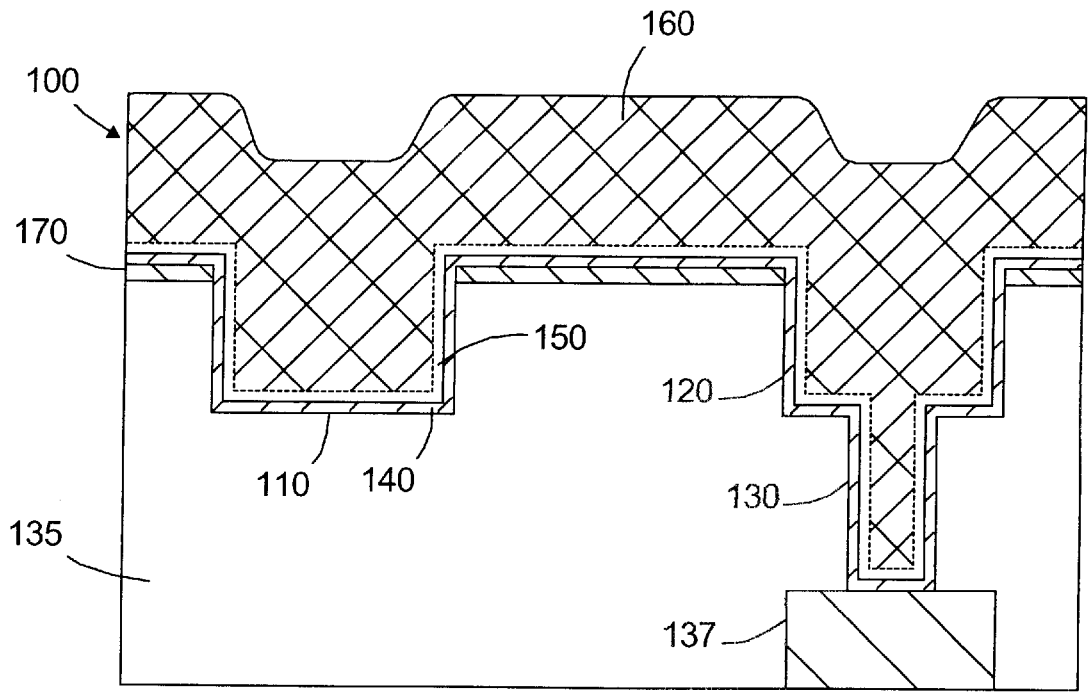
FIGS. 1A and 1B are cross section views of an exemplary semiconductor device including interconnect features filled with a conductive material.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
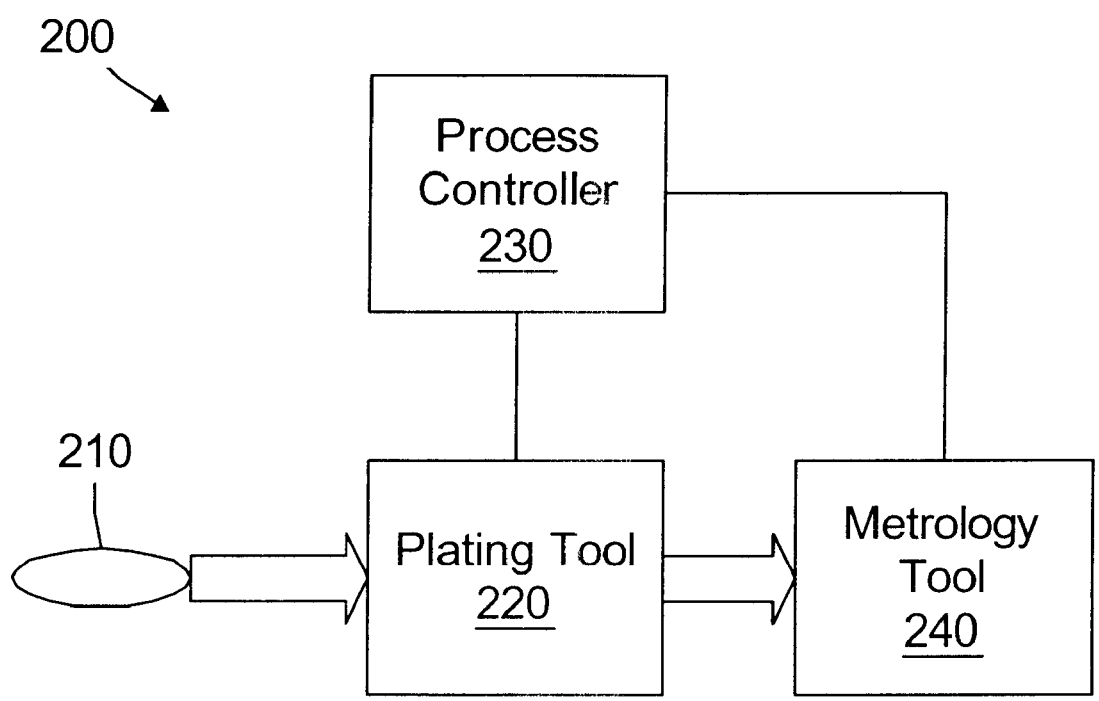
FIG. 2 is a simplified diagram of an illustrative processing line for processing wafers in accordance with one illustrative embodiment of the present invention.

Referring first to FIG. 2, a simplified diagram of an illustrative processing line 200 for processing wafers 210 in accordance with the present invention is provided. The processing line 200 includes a plating tool 220, a process controller 230, and a metrology tool 240. In the illustrated embodiment, the plating tool 220 is a useful for plating a copper layer on the semiconductor wafer 210 to form interconnect structures. Although the invention is described as it may be implemented for controlling the thickness of a plated copper layer for filling an interconnect structure, its application is not so limited, as it may be applied to the plating of other types of process layers in the fabrication of various types of features.

The process controller 230 interfaces with the plating tool 220 for modifying operating parameters of the plating tool 220 based on a model relating the recipe parameters (e.g., plating time, electrolyte temperature, potential, etc.) to the thickness of the plated copper layer. The metrology tool 240 provides thickness measurements to the process controller 230 for updating the model and predicting future recipe parameters.

Figure 1B:
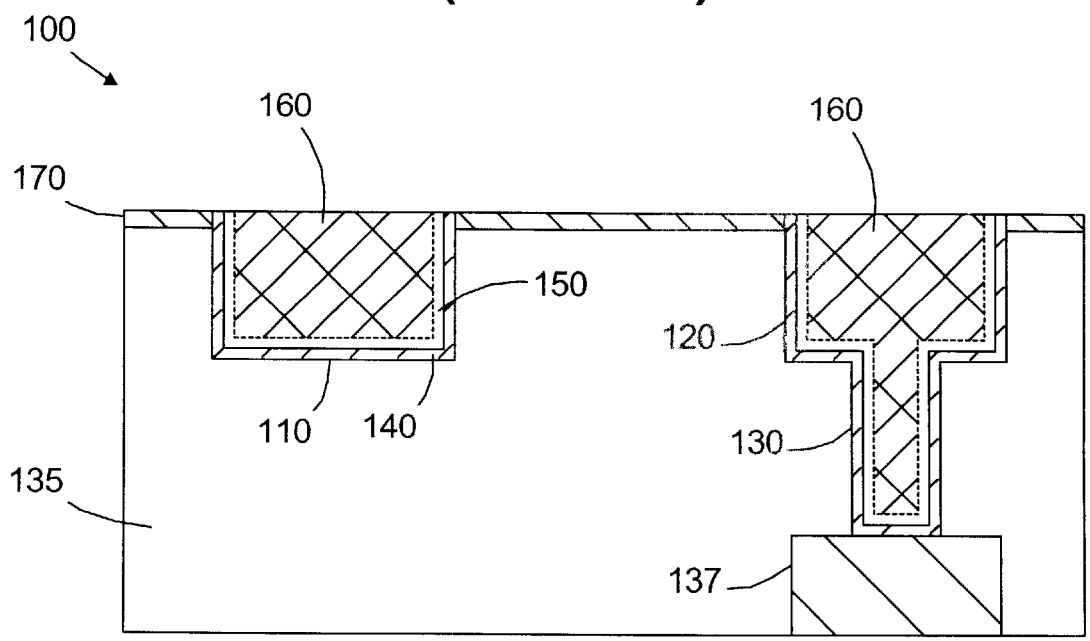

A typical plating process for plating a layer of material on a wafer includes immersing the wafer into an electrolyte bath and applying a voltage to the previously formed seed layer (e.g., see FIG. 1). The particular ranges for the temperature of the electrolyte solution potential applied to the seed layer depend on the particular application, the thickness of the layer being formed, and the underlying topology. The dynamic ranges the process controller 230 may employ for determining the temperature and potential parameters in the recipe may be bounded by practical grain size limitations. Specific grain size limitations are also application dependent and may vary based on the material being plated, the desired thickness of the material, etc.

The control model employed by the process controller 230 may be generated and/or updated based on input from the metrology tool 240 and the recipe parameters used to form the measured wafer 210. An exemplary metrology tool 240 suitable for measuring the thickness of the copper layer is Metapulse tool offered by Rudolph Technologies of Flanders, NJ. Another technique for determining layer thickness is described in U.S. patent application Ser. No. 09/891898 (Attorney Docket No. 2000.075900, Client Docket No. TT4637), entitled "METHOD AND APPARATUS FOR DETERMINING OUTPUT CHARACTERISTICS USING TOOL STATE DATA," filed in the names of Alexander J. Pasadyn and Thomas J. Sonderman, and incorporated herein by reference in its entirety. The tool state monitor described in the above referenced patent application may function as the metrology tool 240 in the context of the embodiments described herein.

In the illustrated embodiment, the process controller 230 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 230 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Based on copper layer thickness measured by the metrology tool 240, the process controller 230 predicts operating recipe parameters to affect the copper layer thickness for the next wafer or lot such that it is closer to a target value. The primary factors that affect the thickness of the plated copper layer are plating time, temperature, and potential. An increased temperature or potential results in a generally linear increase in copper layer thickness for a given plating time.

In changing the recipe, the process controller 230 may change a parameter or parameters within a baseline recipe or, alternatively, the process controller 230 may provide an entirely new recipe. For example, the process controller 230 may incrementally increase or decrease the previous plating time, electrolyte temperature, or potential in the recipe or it may determine a new absolute plating time, temperature or potential based on the measured copper layer thickness.

The plating thickness model may be generated by the process controller 230, or alternatively, it may be generated by a different processing resource (not shown) and stored on the process controller 230 after being developed. The plating thickness model may be developed using the plating tool 220 or on a different tool (not shown) having similar operating characteristics. For purposes of illustration, it is assumed that the plating thickness model is generated and updated by the process controller 230 or other processing resource based on actual performance of the plating tool 220 as measured by the metrology tool 240. The plating thickness model is trained based on historical data collected from numerous processing runs of the plating tool 220.

Various modeling techniques, well known to those of ordinary skill in the art, are suitable for implementing the copper plating model. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Once the control model is sufficiently tested and/or trained, it may be used in a production environment to predict the operation of plating tool 220. The process controller 230 predicts the plating control parameters, and the operating recipe of the plating tool 220 is modified accordingly. In the production environment, periodic measurements from the metrology tool 240 are provided as feedback to the process controller 230 for updating the plating process model.

Due to the time required to measure the copper layer thickness, there may be a lag of one or more lots before the operating recipe of the plating tool 220 can be updated. The process controller 230 updates the operating recipe as soon as data from the metrology tool 240 is available and is processed in accordance with the plating thickness model.

Figure 3:
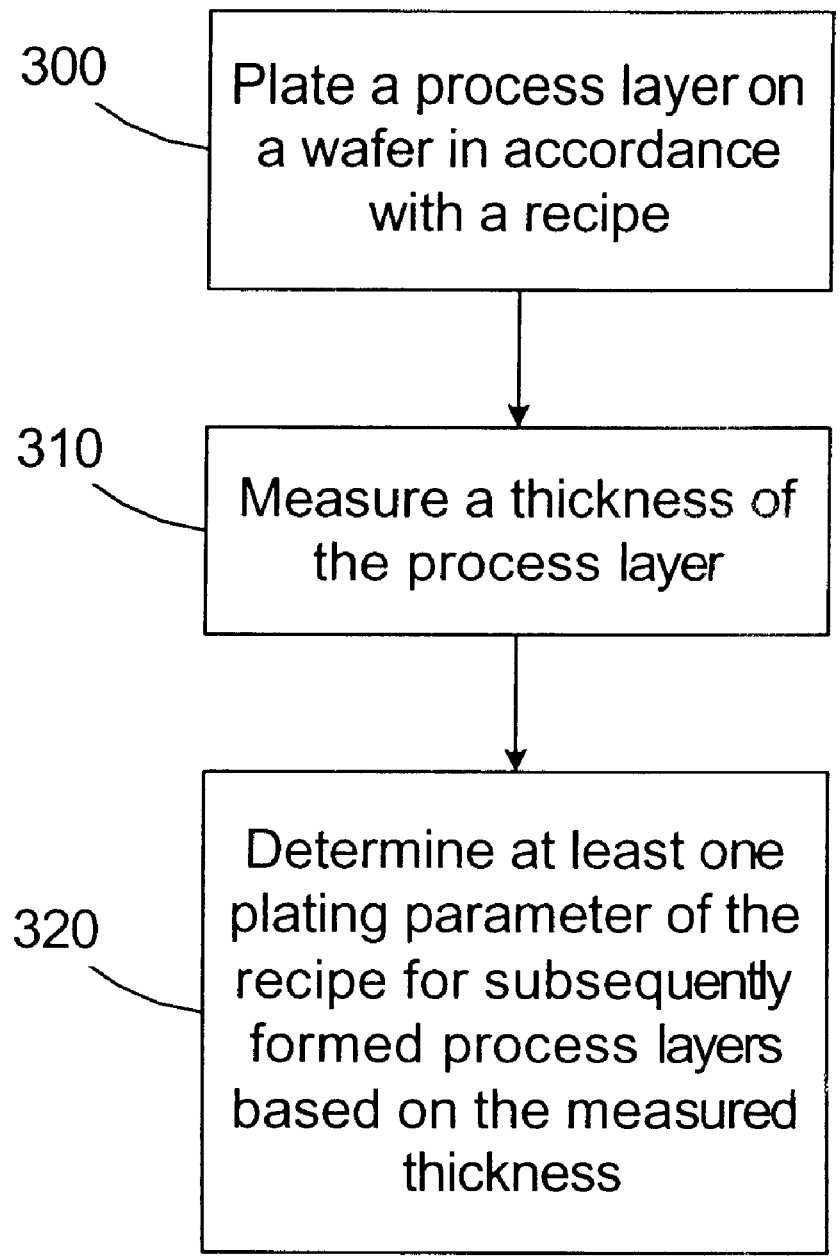
FIG. 3 is a simplified flow diagram of a method for controlling a plating process in accordance with another illustrative embodiment of the present invention.

Referring now to FIG. 3, a flow diagram of a method for controlling a plating process in accordance with another illustrative embodiment of the present invention is provided. In block 300, a process layer (e.g., copper) is plated on a wafer in accordance with a recipe. In block 310, a thickness of the process layer is measured. In block 320, at least one plating parameter (e.g., plating time, electrolyte temperature, potential) of the recipe is determined for a subsequently formed process layer based on the measured thickness.

Using thickness measurement feedback to alter operating recipe parameters for subsequent production runs as described above has numerous advantages. By controlling the thickness of the copper layer, the consistency of the performance of the devices produced is increased. Also, material waste (e.g., excess copper) and processing inefficiencies (e.g., polishing time required for thicker layers) are reduced Generally, tighter process control yields higher a higher percentage of faster, more profitable, semiconductor devices. The process control may also be performed on a run-to-run basis. Run-to-run control allows incremental changes in the performance of the plating tool 220 to be addressed such that the thickness consistency can be maintained.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a plating process, comprising:
    plating a process layer on a wafer in accordance with a recipe;
    measuring a thickness of the process layer; and
    determining at least one plating parameter of the recipe for subsequently formed process layers based on the measured thickness.

2. The method of claim 1, wherein determining the at least one plating parameter of the recipe further comprises determining at least one of a plating time, an electrolyte temperature, and a potential in the recipe.

3. The method of claim 2, wherein determining the at least one plating parameter of the recipe further comprises increasing at least one of the plating time, the electrolyte temperature, and the potential in the recipe in response to the measured thickness of the process layer being less than a target value.

4. The method of claim 2, wherein determining the at least one plating parameter of the recipe further comprises decreasing at least one of the plating time, the electrolyte temperature, and the potential in the recipe in response to the measured thickness of the process layer being greater than a target value.

5. The method of claim 1, wherein plating the process layer further comprises plating a copper layer.

6. A method for controlling a plating process, comprising:
    plating a process layer on a wafer in accordance with a recipe;
    measuring a thickness of the process layer; and
    determining an electrolyte temperature parameter of the recipe for subsequently formed process layers based on the measured thickness.

7. The method of claim 6, wherein determining the electrolyte temperature parameter of the recipe further comprises increasing the electrolyte temperature parameter in response to the measured thickness of the process layer being less than a target value.

8. The method of claim 6, wherein determining the electrolyte temperature parameter of the recipe further comprises decreasing the electrolyte temperature parameter in response to the measured thickness of the process layer being greater than a target value.

9. The method of claim 6, wherein plating the process layer further comprises plating a copper layer.

10. A method for controlling a plating process, comprising:
    plating a process layer on a wafer in accordance with a recipe;
    measuring a thickness of the process layer; and
    determining a potential parameter of the recipe for subsequently formed process layers based on the measured thickness.

11. The method of claim 10, wherein determining the potential parameter of the recipe further comprises increasing the potential parameter in response to the measured thickness of the process layer being less than a target value.

12. The method of claim 10, wherein determining the potential parameter of the recipe further comprises decreasing the potential parameter in response to the measured thickness of the process layer being greater than a target value.

13. The method of claim 10, wherein plating the process layer further comprises plating a copper layer.

14. A processing line, comprising:
   a plating tool adapted to form a process layer on a wafer in accordance with a recipe;
   a metrology tool adapted to measure a thickness of the process layer; and
   a process controller adapted to determine at least one plating parameter of the recipe for subsequently formed process layers based on the measured thickness.

15. The processing line of claim 14, wherein the process controller is further adapted to determine at least one of a plating time, an electrolyte temperature, and a potential in the recipe.

16. The processing line of claim 15, wherein the process controller is further adapted to increase at least one of the plating time, the electrolyte temperature, and the potential in the recipe in response to the measured thickness of the process layer being less than a target value.

17. The processing line of claim 15, wherein the process controller is further adapted to decrease at least one of the plating time, the electrolyte temperature, and the potential in the recipe in response to the measured thickness of the process layer being greater than a target value.

18. The processing line of claim 14, wherein the process layer comprises a copper layer.

19. A processing line, comprising:
   a plating tool adapted to form a process layer on a wafer in accordance with a recipe;
   a metrology tool adapted to measure a thickness of the process layer; and
   a process controller adapted to determine an electrolyte temperature parameter of the recipe for subsequently formed process layers based on the measured thickness.

20. The processing line of claim 19, wherein the process controller is further adapted to increase the electrolyte temperature parameter in response to the measured thickness of the process layer being less than a target value.

21. The processing line of claim 19, wherein the process controller is further adapted to decrease the electrolyte temperature parameter in response to the measured thickness of the process layer being greater than a target value.

22. The processing line of claim 19, wherein the process layer comprises a copper layer.

23. A processing line, comprising:
   a plating tool adapted to form a process layer on a wafer in accordance with a recipe;
   a metrology tool adapted to measure a thickness of the process layer; and
   a process controller adapted to determine a potential parameter of the recipe for subsequently formed process layers based on the measured thickness.

24. The processing line of claim 23, wherein the process controller is further adapted to increase the potential parameter in response to the measured thickness of the process layer being less than a target value.

25. The processing line of claim 23, wherein the process controller is further adapted to decrease the potential parameter in response to the measured thickness of the process layer being greater than a target value.

26. The processing line of claim 23, wherein the process layer comprises a copper layer.

27. A processing line, comprising:
   means for plating a process layer on a wafer in accordance with a recipe;
   means for measuring a thickness of the process layer; and
   means for determining at least one plating parameter of the recipe for subsequently formed process layers based on the measured thickness.

* * * * *